(12) United States Patent
Lee et al.

(10) Patent No.: US 12,266,419 B2
(45) Date of Patent: Apr. 1, 2025

(54) SEMICONDUCTOR DEVICE

(71) Applicant: Samsung Electronics Co., Ltd., Suwon-si (KR)

(72) Inventors: Dojeon Lee, Hwaseong-si (KR); Junehong Park, Seongnam-si (KR); Kichang Jang, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 386 days.

(21) Appl. No.: 17/944,414

(22) Filed: Sep. 14, 2022

(65) Prior Publication Data

US 2023/0206962 A1 Jun. 29, 2023

(30) Foreign Application Priority Data

Dec. 23, 2021 (KR) .................. 10-2021-0185671
Mar. 22, 2022 (KR) .................. 10-2022-0035211

(51) Int. Cl.
| | | |
|---|---|---|
| G11C 7/04 | (2006.01) | |
| G11C 5/06 | (2006.01) | |
| G11C 5/14 | (2006.01) | |
| G11C 7/10 | (2006.01) | |

(52) U.S. Cl.
CPC ............. *G11C 7/04* (2013.01); *G11C 5/063* (2013.01); *G11C 5/147* (2013.01); *G11C 7/1039* (2013.01)

(58) Field of Classification Search
CPC ......... G11C 7/04; G11C 7/1039; G11C 5/063; G11C 5/147
See application file for complete search history.

(56) References Cited

U.S. PATENT DOCUMENTS

| | | |
|---|---|---|
| 9,874,886 B2 | 1/2018 | Kim |
| 10,054,967 B2 | 8/2018 | Lee |
| 10,151,644 B2 | 12/2018 | Hsu et al. |
| 10,290,330 B1 | 5/2019 | Kamath et al. |
| 10,437,271 B2 | 10/2019 | Wan et al. |
| 10,613,571 B2 | 4/2020 | Sarkar et al. |
| 2009/0302954 A1 | 12/2009 | Chen et al. |
| 2010/0195414 A1 | 8/2010 | Kim et al. |
| 2016/0187207 A1 | 6/2016 | Li |
| 2019/0078940 A1 | 3/2019 | Choi et al. |
| 2019/0155323 A1 | 5/2019 | Kim et al. |
| 2020/0149975 A1 | 5/2020 | Cho et al. |

*Primary Examiner* — Alfredo Bermudez Lozada
(74) *Attorney, Agent, or Firm* — Harness, Dickey & Pierce, P.L.C.

(57) ABSTRACT

A semiconductor device includes a first voltage generating circuit configured to output a first voltage based on temperature; an analog-to-digital converter configured to convert the first voltage into a temperature code; a code conversion logic configured to output an offset code and a level code of a temperature section which the temperature belongs among temperature sections based on the temperature code; an offset voltage generating circuit configured to output an offset voltage based on the offset code; a second voltage generating circuit configured to output a second voltage having a constant value within a temperature section based on the level code; and a temperature compensation voltage generating circuit configured to receive the first voltage, the second voltage, the offset voltage, and a feedback voltage and output a temperature compensation voltage, the feedback voltage based on the first voltage, the second voltage, and the offset voltage.

20 Claims, 13 Drawing Sheets

SEMICONDUCTOR DEVICE

CROSS-REFERENCE TO RELATED APPLICATION(S)

This application claims benefit of priority to Korean Patent Application No. 10-2021-0185671 filed on Dec. 23, 2021 and Korean Patent Application No. 10-2022-0035211 filed on Mar. 22, 2022 in the Korean Intellectual Property Office, the disclosures of which are incorporated herein by reference in their entirety.

BACKGROUND

Example embodiments of the present disclosure relate to semiconductor devices.

A semiconductor device storing data may be applied to various electronic devices including a computer, a smart phone, and a tablet PC as a data storage space. The semiconductor device may include memory cells for storing data, and may execute operations such as a program operation, a read operation, and an erase operation by controlling a level of a voltage supplied to memory cells. To improve performance of the semiconductor device, it may be necessary to control memory cells in consideration of various factors which may affect properties of the memory cells.

SUMMARY

Some example embodiments of the present disclosure is to provide a semiconductor including a temperature compensation circuit which may, by digitally converting a voltage output by a temperature sensor and dividing the voltage into a plurality of sections, and calculating a temperature compensation voltage in an analog manner in each of the plurality of sections, swiftly and accurately sense temperature.

According to some example embodiments of the present disclosure, a semiconductor device includes a first voltage generating circuit configured to output a first voltage based on a temperature; an analog-to-digital converter configured to convert the first voltage into a temperature code; a code conversion logic configured to output an offset code and a level code of a temperature section to which the temperature belongs among a plurality of temperature sections based on the temperature code; an offset voltage generating circuit configured to output an offset voltage based on the offset code; a second voltage generating circuit configured to output a second voltage having a constant value within a temperature section to which the temperature belongs among the plurality of temperature sections based on the level code; and a temperature compensation voltage generating circuit configured to receive the first voltage, the second voltage, the offset voltage, and a feedback voltage, the feedback voltage being based on the first voltage, the second voltage, and the offset voltage, and to output a temperature compensation voltage.

According to some example embodiments of the present disclosure, a semiconductor device includes a cell region including a plurality of memory cells; and a peripheral circuit region including peripheral circuits driving the cell region, the peripheral circuit region including a first voltage generating circuit configured to output a first voltage based on a temperature; an analog-to-digital converter configured to convert the first voltage into a temperature code; an offset voltage generating circuit configured to output an offset voltage of a temperature section to which the temperature belongs among a plurality of temperature sections based on the temperature code; a second voltage generating circuit configured to output a second voltage having a constant value within a temperature section to which the temperature belongs among the plurality of temperature sections based on the temperature code; and a temperature compensation voltage generating circuit configured to receive the first voltage, the second voltage, the offset voltage, and the feedback voltage and to output a temperature compensation voltage, the feedback voltage being based on the first voltage, the second voltage, and the offset voltage.

According to some example embodiments of the present disclosure, a semiconductor device includes a voltage generating circuit configured to output an offset voltage corresponding to each of the plurality of temperature sections based on a first voltage, the first voltage based on a temperature of an integrated circuit, and the voltage generating circuit configured to output a constant second voltage in each of the plurality of temperature sections based on the first voltage; and a temperature compensation voltage generating circuit configured to receive a first voltage, a second voltage, an offset voltage, and a feedback voltage and to output a temperature compensation voltage, the feedback voltage being based on the first voltage, the second voltage, and the offset voltage.

BRIEF DESCRIPTION OF DRAWINGS

The above and other aspects, features, and advantages of the present disclosure will be more clearly understood from the following detailed description, taken in combination with the accompanying drawings, in which.

DETAILED DESCRIPTION

Hereinafter, example embodiments of the present disclosure will be described as follows with reference to the accompanying drawings.

Figure 1:
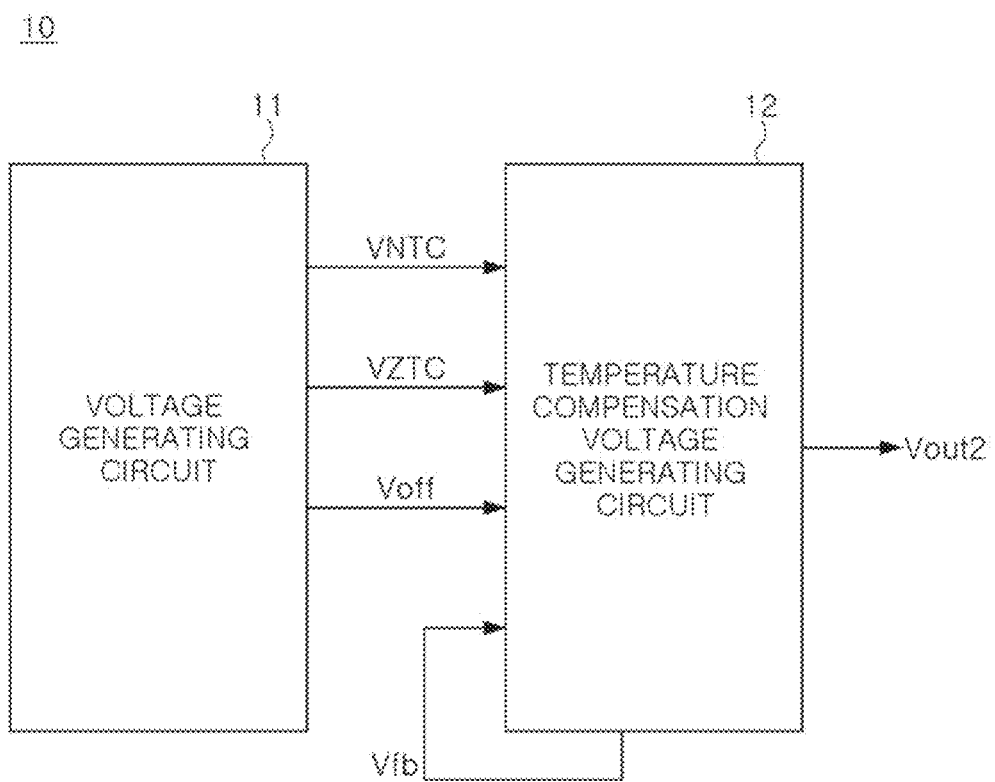
FIGS. 1 to 3 are block diagrams illustrating a semiconductor device according to some example embodiments of the present disclosure.
Figure 2:
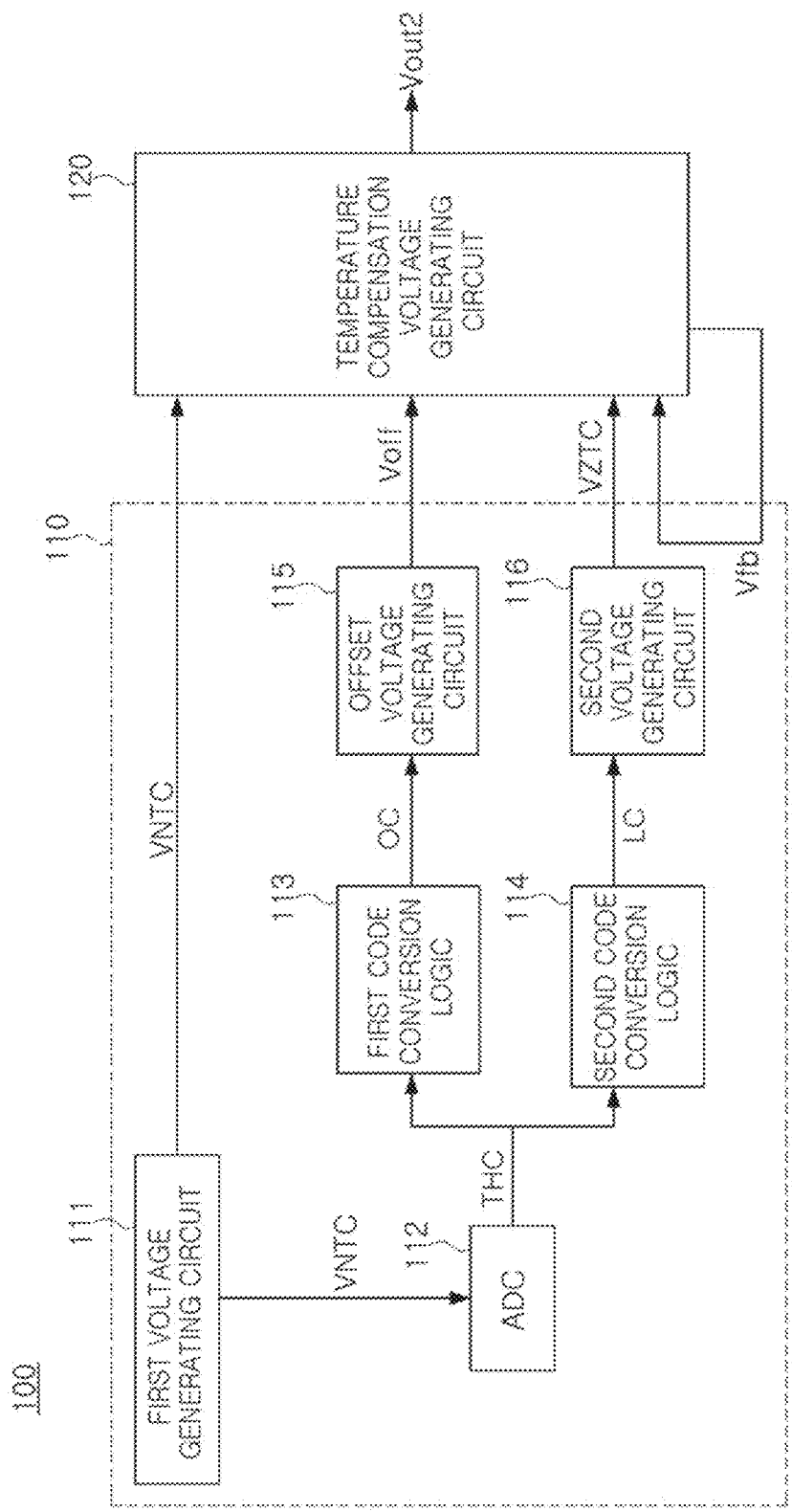
Figure 3:
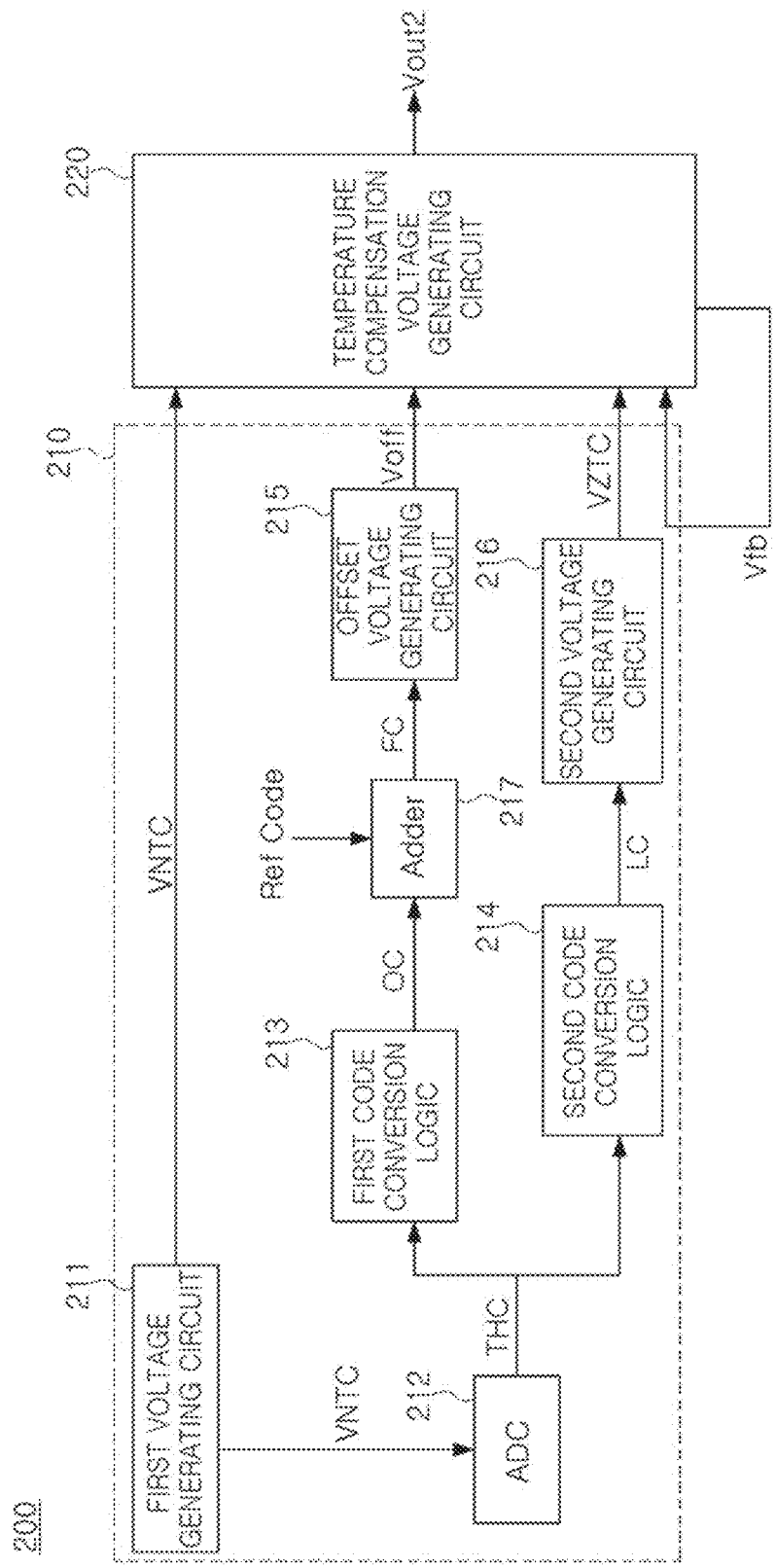

FIGS. 1 to 3 are block diagrams illustrating a semiconductor device according to some example embodiments.

First, referring to FIG. 1, a semiconductor device 10 in some example embodiments may include a voltage generating circuit 11 configured to output a first voltage VNTC, a second voltage VZTC, and an offset voltage Voff and a temperature compensation voltage generating circuit 12. The temperature compensation voltage generating circuit 12 may receive a first voltage VNTC, a second voltage VZTC, and an offset voltage Voff from the voltage generating circuit 11, may generate a feedback voltage Vfb and may receive the feedback voltage again, and may output a temperature compensation voltage Vout2. For example, a level of the feedback voltage Vfb output by the temperature compensation voltage generating circuit 12 may be determined by the first voltage VNTC, the second voltage VZTC, and the offset voltage Voff. The first voltage VNTC may change according to temperature. The second voltage VZTC may have different levels in different temperature sections, and may have a constant level in a single temperature section.

When the semiconductor device 10 is implemented as a memory device storing data, threshold voltages of memory cells may change according to temperature. The temperature compensation voltage Vout2 may be used to differently apply voltages input to the memory cells during program, read, and erase operations in response to a change in a threshold voltage according to a change in temperature. Accordingly, an accurate operations of the memory device may be implemented using the temperature compensation voltage Vout2.

In the description below, referring to FIG. 2, the semiconductor device 100 in some example embodiments may include a voltage generating circuit 110 and a temperature compensation voltage generating circuit 120. The voltage generating circuit 110 may include a first voltage generating circuit 111, an analog-to-digital converter 112, a first code conversion logic 113, a second code conversion logic 114, an offset voltage generating circuit 115, and a second voltage generating circuit 116.

The semiconductor device 100 in some example embodiments may include the first voltage generating circuit 111 operating as a temperature sensor. The first voltage generating circuit 111 may output a first voltage VNTC which may change according to temperature. For example, as the temperature decreases, the level of the first voltage VNTC may increase.

The analog-to-digital converter 112 may receive the first voltage VNTC output by the first voltage generating circuit 111 and may output a temperature code THC. The temperature code THC may become input values of the first code conversion logic 113 for generating the offset voltage Voff and the second code conversion logic 114 for generating the second voltage VZTC.

In some example embodiments, the entire temperature section may be divided into a plurality of temperature sections according to resolution of the analog-to-digital converter 112. A temperature code THC output by the analog-to-digital converter 112 may be determined according to a temperature section to which the first voltage VNTC belongs. For example, as the temperature of the temperature section to which the first voltage VNTC belongs decreases, a value of the temperature code THC may increase.

The first and second code conversion logics 113 and 114 may output an offset code OC and a level code LC of a temperature section to which an arbitrary temperature belongs among the plurality of temperature sections based on the temperature code THC. The first code conversion logic 113 receiving the temperature code THC may output an offset code OC. The offset code OC may be N-bit digital data for outputting an offset voltage Voff (where N is a natural number). The number of bits of the offset code OC may be determined according to resolution of the offset voltage generating circuit 115. In other words, when resolution of the offset voltage generating circuit 115 is N bits, the offset code may also be N bits of data. As resolution of the offset voltage generating circuit 115 increases, the offset voltage Voff may be precisely adjusted in response to a change in temperature.

The second code conversion logic 114 may receive a temperature code THC and may output a level code LC. The level code LC may be M-bit digital data (where M is a natural number). The number of bits of the level code LC may be determined according to resolution of the second voltage generating circuit 116. In other words, when resolution of the second voltage generating circuit 116 is M-bit, the level code LC may also be M-bit data. As resolution of the second voltage generating circuit 116 increases, the second voltage VZTC may be precisely adjusted in response to a change in temperature. The number of bits of the offset code OC and the level code LC may be the same as or different from the number of bits of the temperature code THC.

The offset voltage generating circuit 115 may receive an offset code OC and may output an offset voltage Voff. The offset voltage Voff may be used to determine a level of the temperature compensation voltage Vout2 to be compensated for in response to a change in temperature.

The second voltage generating circuit 116 may receive the level code LC and may output the second voltage VZTC. A level of the second voltage VZTC may be determined according to a value of the level code LC. For example, as the value of the level code LC increases, the level of the second voltage VZTC may increase, and as the value of the level code LC decreases, the level of the second voltage VZTC may increase.

The temperature compensation voltage generating circuit 120 may receive the first voltage VNTC, the second voltage VZTC, the offset voltage Voff, and the feedback voltage Vfb to output the temperature compensation voltage Vout2.

The feedback voltage Vfb may be determined by the first voltage VNTC, the second voltage VZTC, and the offset voltage Voff, and the temperature compensation voltage Vout2 may be determined by the feedback voltage Vfb. In some example embodiments, the feedback voltage Vfb may increase as the offset voltage Voff increases, and the feedback voltage Vfb may increase as the difference between the first voltage VNTC and the second voltage VZTC increases.

The temperature compensation voltage Vout2 may increase as the feedback voltage Vfb increases. Accordingly, the temperature compensation voltage Vout2 may increase as the offset voltage Voff increases, and the temperature compensation voltage Vout2 may increase as the difference between the first voltage VNTC and the second voltage VZTC increases.

Referring to FIG. 3, the semiconductor device 200 in some example embodiments may include a voltage generating circuit 210 and a temperature compensation voltage generating circuit 220. Operations of a first voltage generating circuit 211, an analog-to-digital converter 212, a first code conversion logic 213, a second code conversion logic 214, an offset voltage generating circuit 215, a second voltage generating circuit 216, and the temperature compensation voltage generating circuit 220 may be understood with reference to the example embodiment described above with reference to FIG. 2.

Differently from the example embodiment in FIG. 2, in the semiconductor device 200 according to the example embodiment illustrated in FIG. 3, the voltage generating circuit 210 may further include an adder 217.

The adder 217 may output a final code FC obtained by summing the reference code Ref Code and the offset code OC. In other words, the final code FC may be digital data obtained by adding an offset code OC and a reference code Ref Code to the reference code. The reference code Ref Code may be digital data outputting a temperature compensation voltage at the highest temperature point in the entire temperature section. The offset voltage generating circuit 215 may receive the final code FC and may output the offset voltage Voff.

Figure 4:
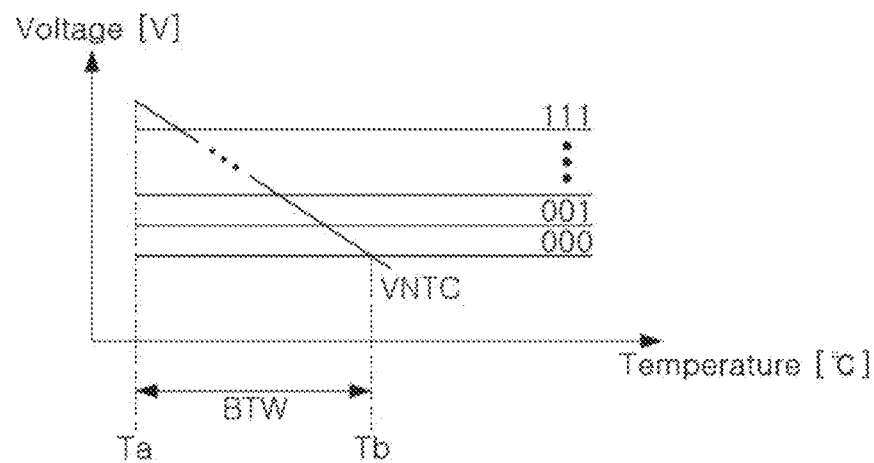
FIG. 4 is a graph illustrating operations of a semiconductor device according to some example embodiments of the present disclosure.

FIG. 4 is a graph illustrating operations of a semiconductor device according to some example embodiments.

FIG. 4 may be a graph illustrating operations of a first voltage generating circuit for outputting a first voltage VNTC, and an analog-to-digital converter for converting the first voltage VNTC into a temperature code THC which may be digital data. Referring to FIG. 4, the first voltage VNTC may increase as the temperature decreases.

In some example embodiments illustrated in FIG. 4, the temperature code THC may be data of 3 bits, which may be because resolution of the analog-to-digital converter is 3 bits. In other words, when resolution of the analog-to-digital converter is L-bit, the temperature code THC may also be L-bit data, and in this case, the entire temperature section may be divided into a $2^L$ number of temperature sections (L is a natural number). For example, the temperature code THC may be data of 2 bits to 5 bits. In some example embodiments illustrated in FIG. 4, the temperature code THC may have a value of "000" to "111" according to the first voltage VNTC.

By the analog-to-digital converter, the entire temperature section BTW may be divided into a plurality of temperature sections, and a single temperature code THC may be assigned to each of the plurality of temperature sections. The first voltage VNTC in a range matching a single temperature section may be converted into a single temperature code THC. For example, the number of the plurality of temperature sections may be determined according to resolution of the analog-to-digital converter determining the number of bits of the temperature code THC, and the plurality of temperature sections may have the same temperature range.

For example, when the temperature code THC is 3-bit data, the highest temperature section may correspond to the temperature code THC "000", the second highest temperature section may correspond to the temperature code THC "001", and the lowest temperature section may correspond to a temperature code THC "111". However, in some example embodiments, the matching relationship between the temperature code THC and each of the plurality of temperature sections may be varied. For example, the highest temperature section may correspond to the temperature code THC "111", and the lowest temperature section may correspond to the temperature code "000".

Figure 5:
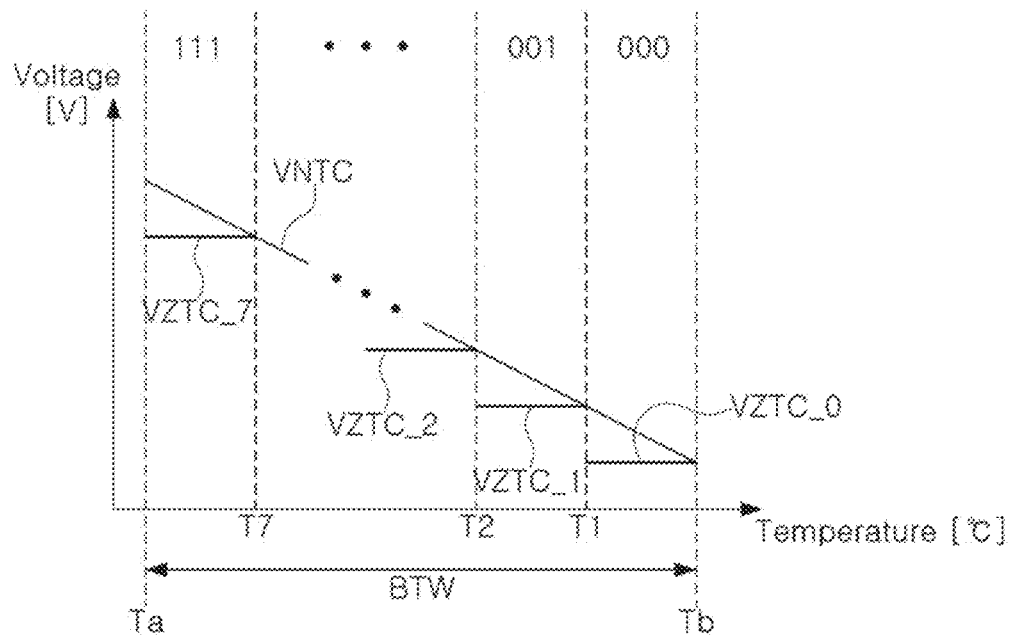
FIG. 5 is a graph illustrating operations of a semiconductor device according to some example embodiments of the present disclosure.

FIG. 5 is a graph illustrating operations of a semiconductor device according to some example embodiments.

As described above with reference to FIG. 4, the first voltage VNTC output by the first voltage generating circuit may increase as the temperature decreases in the entire temperature section BTW. However, the second voltage VZTC may have a constant level in each of the plurality of temperature sections, and may have different levels in different temperature sections.

For example, when the temperature code THC is 3-bit data, the entire temperature section may be divided into 8 temperature sections. When the analog-to-digital converter outputs the temperature code THC, the second code conversion logic may convert the temperature code THC in each temperature section into a level code LC. The number of bits of the level code LC may be the same as or different from the number of bits of the temperature code THC. As described above with reference to FIG. 2, the number of bits of the level code LC may be determined according to resolution of the second voltage generating circuit.

Referring to FIG. 5, the second voltage generating circuit may receive each level code LC and output a second voltage VZTC in each temperature section. The second voltage VZTC may be "VZTC_0" in the range of the highest temperature section corresponding to the level code LC "000", the second voltage VZTC may be "VZTC_1" in the range of the temperature section corresponding to the level code LC "001", and the second voltage VZTC may be "VZTC_7" in the temperature section range corresponding to the level code LC "111". However, some example embodiments thereof is not limited thereto, and the matching relationship between the level code LC and the second voltage VZTC may be varied in some example embodiments.

The second voltage VZTC determined according to the level code LC may be the same as the first voltage VNTC at a start point of each of the plurality of temperature sections in each of the plurality of temperature sections. In other words, the second voltage VZTC determined according to the level code LC may be the same as the first voltage VNTC corresponding to the highest temperature in each of the plurality of temperature sections. Referring to FIG. 5, a first voltage VNTC corresponding to the highest temperature Tb, which is the highest temperature in the highest temperature section, and a second voltage VNTC_0 determined according to a level code LC of the highest temperature section may have the same level. Similarly, the first voltage VNTC corresponding to the first temperature T1 which may be the highest temperature in the second highest temperature section and the second voltage VZTC_1 determined according to the level code LC of the second highest temperature section may have the same level. The first voltage VNTC corresponding to the seventh temperature T7, which is the highest temperature in the lowest temperature section, and the second voltage VZTC_7, which is determined according to the level code LC of the lowest temperature section, may have the same level.

Figure 6A:
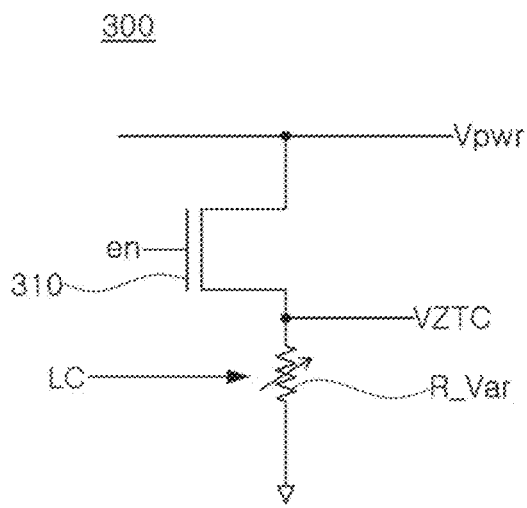
FIGS. 6A and 6B are diagrams illustrating a portion of a configuration of a temperature compensation circuit included in a semiconductor device according to some example embodiments of the present disclosure.
Figure 6B:
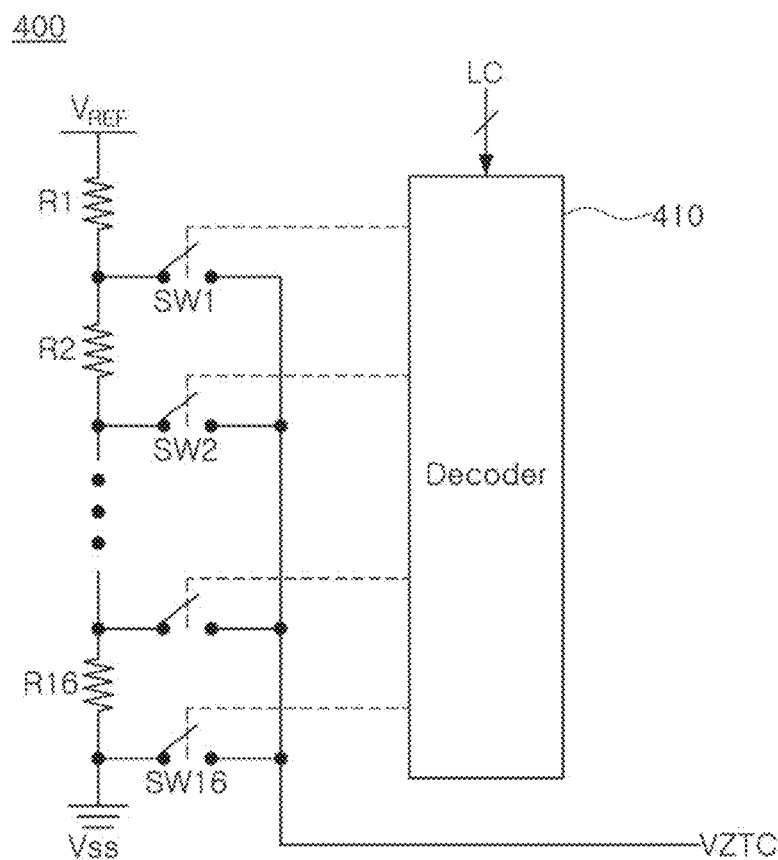

FIGS. 6A and 6B are diagrams illustrating a portion of a configuration of a temperature compensation circuit included in a semiconductor device according to some example embodiments.

A portion of the configurations of the temperature compensation circuit illustrated in FIGS. 6A and 6B may be merely examples, and a portion of the configurations of the temperature compensation circuit may be implemented differently from the examples illustrated in FIGS. 6A and 6B.

Referring first to FIG. 6A, the second voltage generating circuit 300 may include a transistor 310 and a variable resistor R_var. The input terminal of the transistor 310 may receive the first power voltage Vpwr. The output terminal of the transistor 310 may be connected to the variable resistor R_var, and may output the second voltage VZTC. The control terminal of the transistor 310 may receive the enable signal en.

A resistor value of the variable resistor R_var may be varied according to a level code LC. Since the level of the second voltage VZTC is determined according to the resistor value of the variable resistor R_var, the level of the second voltage VZTC may be varied according to the level code LC.

For example, when the level code LC increases, a resistor value of the variable resistor R_var may decrease such that the level of the second voltage VZTC may increase, and when the level code LC decreases, a resistor value of the variable resistor R_var may increase such that the level of the second voltage VZTC may decrease. Or, when the level code LC increases, the resistor value of the variable resistor R_var may increase, such that the level of the second voltage VZTC may decrease, and when the level code LC decreases, the resistor value of the variable resistor R_var may decreases, such that the level of the second voltage VZTC may increase. In some example embodiments, the driving of the variable resistor R_var according to the level code LC may be varied.

Referring to FIG. 6B, in some example embodiments, the second voltage generating circuit 400 may include a decoder 410 for receiving a level code LC, resistors R1-R16, and switches SW1-SW16. One end of the first resistor R1 may be connected to an equipotential end supplying the reference voltage Vref. The resistors R1-R16 may be connected to each other in series. Each of the switches SW1-SW16 may be connected to a node between the resistors R1-R16, and may be turned on or off by an output value of the decoder 410. The level of the second voltage VZTC may be determined according to whether each of the switches SW1-SW16 is turned on or off.

In some example embodiments illustrated in FIG. 6B, resolution of the second voltage generating circuit 400 may be 4 bits, and accordingly, the level code LC may also be 4 bits of data. In this case, the level code LC may have a value of "0000" to "1111,". As a current path between the equipotential terminal supplying the reference voltage Vref and the output second voltage VZTC according to whether each of the switches SW1-SW16 is turned on or turned off according to the data of the level code LC changes, the level of the second voltage VZTC may be determined.

For example, when the level code LC is "0000", only the sixteenth switch SW16 may be turned on and the other switches SW1-SW15 may be turned off such that the second voltage VZTC may be connected to the ground voltage Vss and may have a value of "0". When the level code LC is "1111", only the first switch SW1 may be turned on and the other switches SW2-SW16 may be turned off such that only the first resistor R1 may be connected between the equipotential terminal supplying the reference voltage Vref and the second voltage VZTC. In this case, the second voltage VZTC may have the highest voltage level among voltage levels which may be obtained depending on the level code LC. When the level code LC is "0001", the fifteenth switch SW15 may be turned on and the other switches SW1-14 and SW16 may be turned off such that the resistors R1-R15 other than the sixteenth resistor R16 may be connected between equipotential terminals supplying the reference voltage Vref and the second voltage VZTC. In this case, the level of the second voltage VZTC may have the second lowest voltage level among 16 possible levels depending on the value of the entire level code LC.

However, the operations of the switch according to the data of the level code LC is not limited to the above example, and the operations of the switch according to the data of the level code LC may be varied in some example embodiments. For example, when the level code LC is "0000", only the first switch SW1 other than the other switches SW2-SW16 may be turned on, and when the level code LC is "1111", only the sixteenth switch SW16 other than the other switches SW1-SW15 may be turned on.

Figure 7:
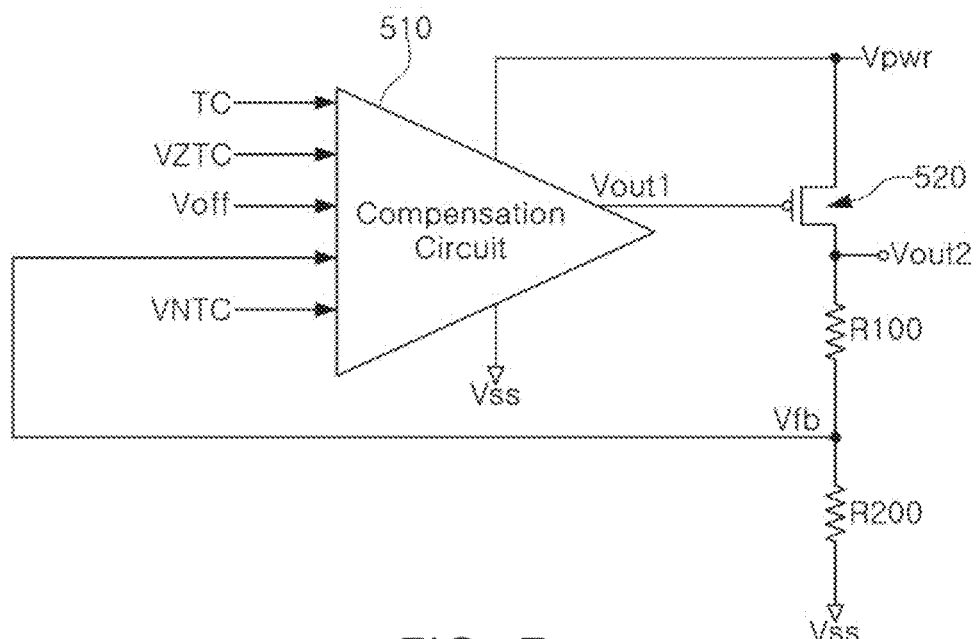
FIG. 7 is a diagram illustrating a portion of a configuration of a temperature compensation circuit included in a semiconductor device according to some example embodiments of the present disclosure.

FIG. 7 is a diagram illustrating a portion of a configuration of a temperature compensation circuit included in a semiconductor device according to some example embodiments.

Referring to FIG. 7, the temperature compensation voltage generating circuit 500 may include a compensation circuit 510, an output transistor 520, and first and second output resistors R100 and R200.

The temperature compensation voltage generating circuit 500 may receive an adjustment code TC, a first voltage VNTC, a second voltage VZTC, an offset voltage Voff, a feedback voltage Vfb, and a first power supply voltage Vpwr. For example, the temperature compensation voltage generating circuit 500 may be configured as a component of a semiconductor device. The semiconductor device may include a logic circuit for performing a predetermined (or, alternatively, desired) operation. For example, when the semiconductor device is a memory device, the logic circuit may perform a program operation for writing data in the memory cells, a read operation for reading data from the memory cells, and an erase operation for erasing data of the memory cells.

The adjustment code TC input to the temperature compensation voltage generating circuit 500 may be determined by a logic circuit. The compensation circuit 510 included in the temperature compensation voltage generating circuit 500 may output an intermediate voltage Vout1 based on an adjustment code TC, a first voltage VNTC, a second voltage VZTC, an offset voltage Voff, a feedback voltage Vfb, and the first power voltage Vpwr. The intermediate voltage Vout1 may be input to the control terminal of the output transistor 520. The output transistor 520 may include an input terminal for receiving the first power voltage Vpwr, and an output terminal of the output transistor 520 may be connected to the first output resistor R100. The other end of the first output resistor R100 may be connected to one end of the second output resistor R200. The other end of the second output resistor R200 may be connected to an equipotential end supplying the second power voltage Vss. For example, the second power voltage Vss may be a ground voltage.

The first output resistor R100 and the second output resistor R200 may provide a voltage division circuit, and a feedback voltage Vfb may be determined by the first output resistor R100 and the second output resistor R200. For example, a level of the feedback voltage Vfb may be determined as in Equation 1 below. A level of the temperature compensation voltage Vout2 may be determined as in Equation 2.

$$Vfb = \frac{(Vout2 - Vss) * R2}{(R1 + R2)} \quad \text{[Equation 1]}$$

$$Vout2 = \left(1 + \frac{R1}{R2}\right) * Vfb \quad \text{[Equation 2]}$$

When the intermediate voltage Vout1 is input to the control terminal of the output transistor 520, the output transistor 520 may be turned on such that a current may flow. A temperature compensation voltage Vout2 may be output at a node between the output transistor 520 and the first output resistor R100 according to a current flowing through the output transistor 520.

The logic circuit of the semiconductor device may change the level of a voltage required to control operations of the semiconductor device based on the temperature compensation voltage Vout2. For example, when the semiconductor device is implemented as a memory device, the threshold voltage of each of the memory cells may increase or decrease according to temperature. In some example embodiments, the level of the read voltage and/or the pass voltage input to the memory cells by the logic circuit in a read operation may change based on the temperature compensation voltage Vout2. Also, the level of the program voltage and/or the pass voltage input to the memory cells by the logic circuit in the program operation may also be determined differently depending on the temperature compensation voltage Vout2.

Figure 8:
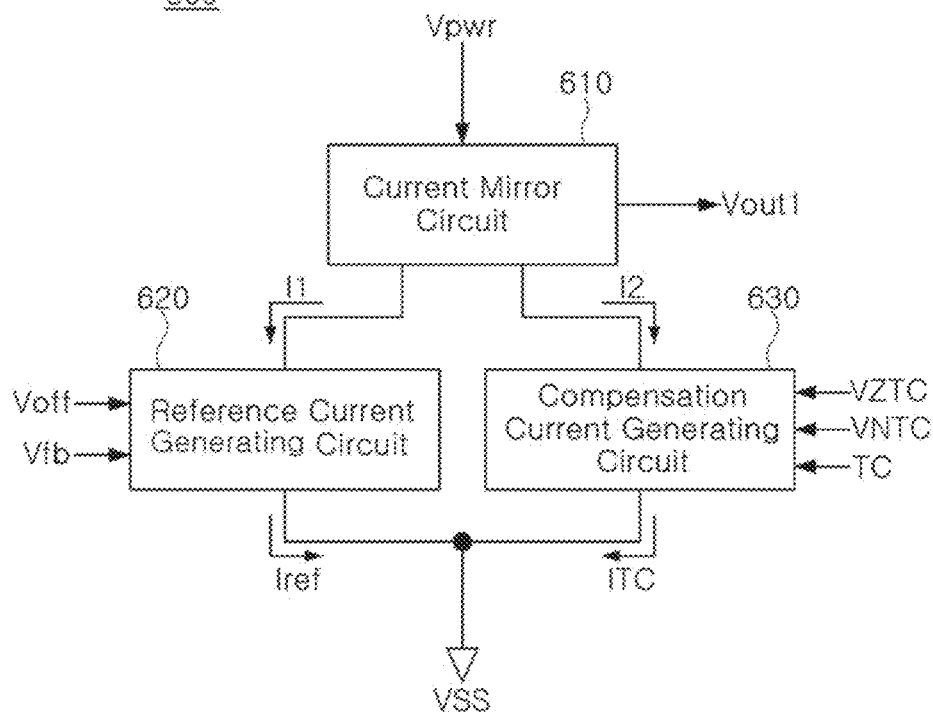
FIG. 8 is a diagram illustrating a portion of a configuration of a temperature compensation circuit included in a semiconductor device according to some example embodiments of the present disclosure.

FIG. 8 is a diagram illustrating a portion of a configuration of a temperature compensation circuit included in a semiconductor device according to some example embodiments.

Referring to FIG. 8, the compensation circuit 600 may include a current mirror circuit 610, a reference current generating circuit 620, and a compensation current generating circuit 630. The current mirror circuit 610 may receive the first power voltage Vpwr and may output the intermediate voltage Vout1. The current mirror circuit 610 may be connected to the reference current generating circuit 620 and the compensation current generating circuit 630.

The reference current generating circuit 620 may receive an offset voltage Voff and a feedback voltage Vfb. The compensation current generating circuit 630 may receive a first voltage VNTC, a second voltage VZTC, and an adjustment code TC. The reference current generating circuit 620 and the compensation current generating circuit 630 may be connected to an equipotential terminal supplying the second power voltage Vss.

The reference current generating circuit 620 may generate the reference current Iref based on the offset voltage Voff and the feedback voltage Vfb. The reference current generating circuit 620 may output the reference current Iref to the equipotential end. The compensation current generating circuit 630 may generate the compensation current ITC based on the first voltage VNTC, the second voltage VZTC, and the adjustment code TC. The compensation current generating circuit 630 may output the compensation current ITC to the equipotential end.

As the reference current Iref is generated by the reference current generating circuit 620, the reference current generating circuit 620 may receive the first current I1 from the current mirror circuit 610. As the compensation current ITC is generated by the compensation current generating circuit 630, the compensation current generating circuit 630 may receive the second current I2 from the current mirror circuit 610. As the first current I1 and the second current I2 are output by the current mirror circuit 610, the intermediate voltage Vout1 output by the current mirror circuit 610 may be determined. In some example embodiments in FIG. 7, the output transistor 520 may receive the intermediate voltage Vout1 output by the current mirror circuit 610.

The current mirror circuit 610 may be configured as a first stage amplifier for outputting the temperature compensation voltage Vout2. The transistor 520 may be configured as a second stage amplifier for outputting the temperature compensation voltage Vout2.

Hereinafter, operations of the current mirror circuit 610, the reference current generating circuit 620, and the compensation current generating circuit 630 will be described in greater detail with reference to FIGS. 9 and 10. FIG.

Figure 9:
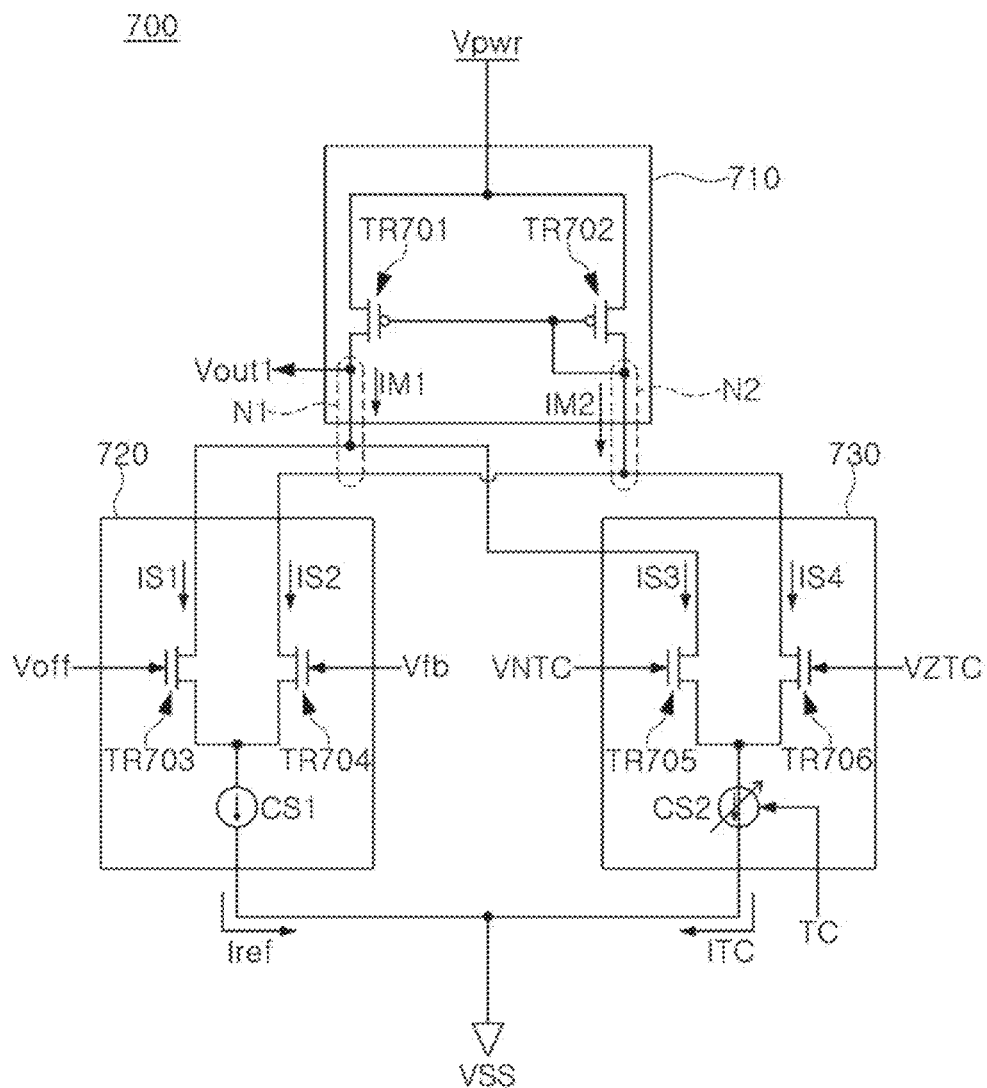
FIG. 9 is a diagram illustrating a portion of a configuration of a temperature compensation circuit included in a semiconductor device according to some example embodiments of the present disclosure.

FIG. 9 is a diagram illustrating a portion of a configuration of a temperature compensation circuit included in a semiconductor device according to some example embodiments.

Referring to FIG. 9, a current mirror circuit 710 may include first and second transistors TR701 and TR702. The reference current generating circuit 720 may include third and fourth transistors TR703 and TR704 and a first current source CS1. The compensation current generating circuit 730 may include fifth and sixth transistors TR705 and TR706 and a second current source CS2.

One end of the first transistor TR701 may be connected to a power node supplying the first power voltage Vpwr. The other end of the first transistor TR701 may be connected to a first node N1. One end of the second transistor TR702 may receive the first power voltage Vpwr. A control terminal of the first transistor TR701 may be connected to a control terminal of the transistor TR702 and a second node N2. A control terminal of the second transistor TR702 may be connected to the second node N2. The first transistor TR701 may transmit the first main current IM1. The second transistor TR702 may transmit the second main current IM2.

The third transistor TR703 may include a control terminal receiving the offset voltage Voff One end of the third transistor TR703 may be connected to the first node N1. The other end of the third transistor TR703 may be connected to the first current source CS1. The fourth transistor TR704 may include a control terminal receiving the feedback voltage Vfb. One end of the fourth transistor TR704 may be connected to the second node N2. The other end of the fourth transistor TR704 may be connected to the first current source CS1. The first current source CS1 may be connected to an equipotential terminal supplying the second power voltage Vss.

The fifth transistor TR705 may include a control terminal receiving the first voltage VNTC. One end of the fifth transistor TR705 may be connected to the node N1. The other end of the fifth transistor TR705 may be connected to the second current source CS2. The sixth transistor TR706 may include a control terminal receiving the second voltage VZTC. One end of the sixth transistor TR706 may be connected to the second node N2. The other end of the sixth transistor TR706 may be connected to the second current source CS2. The second current source CS2 may be connected to an equipotential terminal supplying the second power voltage Vss.

The third transistor TR703 and the fifth transistor TR705 may be connected to each other in parallel. The fourth transistor TR704 and the sixth transistor TR706 may be connected to each other in parallel. In other words, the first main current IM1 may disperse and flow through the third transistor TR703 and the fifth transistor TR705, and the second main current IM2 may disperse and flow through the fourth transistor TR704 and the sixth transistor TR706. The third to sixth transistors TR703-TR706 may be configured as NMOS devices.

In some example embodiments illustrated in FIG. 9, each of the fifth and sixth transistors TR705 and TR706 is illustrated as a single transistor, but for example, each of the fifth and sixth transistors TR705 and TR706 may include a plurality of transistors, and may be selected for at least one of the plurality of transistors based on the adjustment code TC. A plurality of transistors included in each of the fifth and sixth transistors TR705 and TR706 may have different sizes. For example, at least one of the plurality of transistors included in each of the fifth and sixth transistors TR705 and TR706 may be selected according to the adjustment code TC, and accordingly, levels of the third sub-current IS3 and the fourth sub-current IS4 may be determined.

A sum of the level of the first sub-current IS1 flowing through the third transistor TR703 and the level of the second sub-current IS2 flowing through the fourth transistor TR704 may correspond to a reference current Iref. When the third transistor TR703 and the fourth transistor TR704 have substantially the same size, the first sub-current IS1 and the second sub-current IS2 may have substantially the same level. However, some example embodiments thereof is not limited thereto, and the first and second sub-currents IS1 and IS2 having different levels may flow depending on the sizes of the third and fourth transistors TR703 and TR704.

A sum of the level of the third sub-current IS3 flowing through the fifth transistor TR705 and the level of the fourth sub-current IS4 flowing through the sixth transistor TR706 may correspond to the level of the compensation current ITC. When the fifth transistor TR705 and the sixth transistor TR706 have substantially the same size, the third sub-current IS3 and the fourth sub-current IS4 may have substantially the same level. However, some example embodiments thereof is not limited thereto, and the third and fourth sub-currents IS3 and IS4 having different levels depending on properties of the fifth and sixth transistors TR705 and TR706 may be included in some example embodiments.

The first current source CS1 may output a fixed reference current Iref in some example embodiments. The second current source CS2 may output a compensation current ITC changing according to the adjustment code TC. The adjustment code TC may be represented by an S number of bits (S is a natural number). For example, when the adjustment code TC is 6-bit digital data, adjustment code TC may have a value of "000000" to "111111". In the stage of designing and/or manufacturing the semiconductor device, by adjusting the level of the current flowing through the second current source CS2 by adjusting the adjustment code TC, linearity of the temperature compensation may improve.

Referring to FIGS. 8 and 9 together, the level of the first current I1 in FIG. 8 may be the sum of the level of the first sub-current IS1 and the level of the second sub-current IS2. The level of the second current I2 in FIG. 8 may be the sum of the level of the third sub-current IS3 and the level of the fourth sub-current IS4. The intermediate voltage Vout1 output by the first node N1 may be determined according to the level of the first current I1 and the second current I2. The feedback voltage Vfb may be a voltage at a node between the first output resistor R100 and the second output resistor R200, and the temperature compensation voltage Vout2 may be output by the temperature compensation voltage generating circuit. The level of the feedback voltage Vfb may be represented as Equation 3.

$$Vfb = Voff + k * \sqrt{\frac{W705 * IS3}{W704 * IS2}} * (VNTC - VZTC) \qquad \text{[Equation 3]}$$

In Equation 3, "Vfb" may be the level of the feedback voltage Vfb, and "Voff" may be the level of the offset voltage Voff "VNTC" may be the level of the first voltage VZTC, and "VZTC" may be the level of the second voltage VZTC. "W705" may be the width of the fifth transistor TR705, and "W704" may be the width of the fourth transistor TR704. "IS3" may be the level of the third sub-current IS3, and "IS2" may be the level of the second sub-current IS2. "k" is an independent proportionality constant.

The first current source CS1 may output a fixed reference current Iref, and the second current source CS2 may output the compensation current ITC according to the value of the adjustment code TC. The level of the compensation current ITC may change according to the adjustment code TC, and accordingly, the level of the third sub-current IS3 may change. Accordingly, by adjusting the adjustment code TC, a ratio between an intensity of the current flowing through the first sub-current IS1 and the second sub-current IS2 and an intensity of the current flowing through the third sub-current IS3 and the fourth sub-current IS4 may change, and the level of the feedback voltage Vfb may change as represented in Equation 3.

As described above with reference to FIG. 7, the level of the temperature compensation voltage Vout2 may be varied according to the level of the feedback voltage Vfb. Accordingly, by adjusting the feedback voltage Vfb, which determines the level of the temperature compensation voltage Vout2, as described with reference to Equation 3, the temperature compensation voltage Vout2 reflecting changes in temperature may be obtained.

Figure 10:
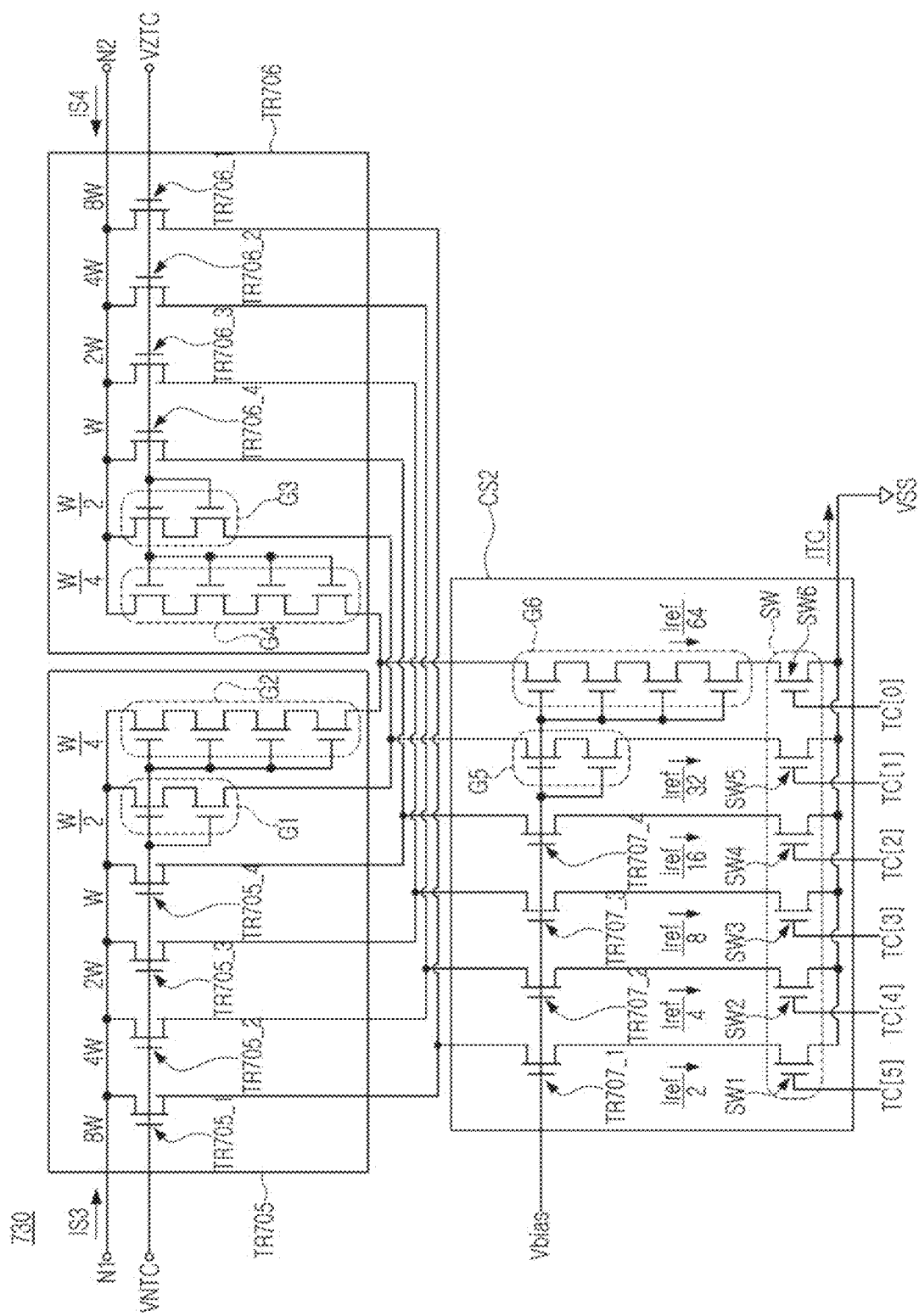
FIG. 10 is a diagram illustrating a portion of a configuration of a temperature compensation circuit included in a semiconductor device according to some example embodiments of the present disclosure.

FIG. 10 is a diagram illustrating a portion of a configuration of a temperature compensation circuit included in a semiconductor device according to some example embodiments.

Referring to FIG. 10, the fifth transistor TR705 of the compensation current generating circuit 730 may include first to fourth sub-transistors TR705_1-TR705_4, a first transistor group G1, and a second transistor group G2. The sixth transistor TR706 may be at least one of the transistors TR706_1-TR706_4, the third transistor group G3, and the third transistor group G4. Widths of transistors included in the fifth transistor TR705 may be different.

For example, a width of the first sub-transistor TR705_1 may be "8 W", a width of the second sub-transistor TR705_2 may be "4 W", a width of the third sub-transistor TR705_3 may be "2 W", and a width of the fourth sub-transistor TR705_4 may be "W". Each of the transistors included in the first transistor group G1 and the second transistor group G2 may have a width of "W". When the first transistor group G1 is selected, the transistors connected to each other in series in the first transistor group G1 may operate together. When the second transistor group G2 is selected, the transistors connected to each other in series in the second transistor group G2 may operate together.

When the transistors are connected to each other in series, a ratio of the width of the channel to a length of the channel may decrease as the length of the channel through which the current passes increases. Accordingly, each of the first transistor group G1 and the second transistor group G2 may function as a transistor having a width narrower than that of an individual transistor.

For example, since the first transistor group G1 includes two transistors connected to each other in series, the first transistor group G1 may allow a current having a level similar to that of a transistor having a width of "(½)*W" to flow in the turned-on state. Similarly, since the second transistor group G2 includes four transistors connected to each other in series, the second transistor group G2 may allow a current having a level similar to that of a transistor having a width of "(¼)*W" in a turned-on state to flow. Accordingly, by controlling the turning on/off of transistors included in the fifth transistor TR705, the amount of current flowing through the turned-on fifth transistor TR705 may change. The sixth transistor TR706 may have a configuration similar to that of the fifth transistor TR705.

The adjustment code TC may be 6-bit digital data. For example, when the adjustment code TC is represented as "100010", "TC[1]" and "TC[5]" may be "1" and "TC[0]", "TC[2]", "TC[3]", and "TC[4]" may be "0". The second current source CS2 may include a switch portion SW. The switch portion SW may include switches SW1-SW6. The switches SW1-SW6 may receive data of the adjustment code TC. Whether the switches SW1-SW6 are turned on or turned off may be determined according to the adjustment code TC. For example, when the adjustment code TC is "100010", the switch SW1 and the switch SW5 corresponding to the logical value "1" may be turned on, and the other switches SW2, SW3, SW4, and SW6 corresponding to the logical value "0" may be turned off.

As a specific switch among the switches SW1-SW6 is turned on, a current may flow through a transistor of the second current source CS2, the fifth transistor TR705, and the sixth transistor TR706 connected to the specific switch. For example, when the switch SW5 is turned on, a current may flow through the fifth transistor group G5, the fifth transistor TR705, and the sixth transistor TR706 connected to the switch SW5. The second current source CS2 may be a current mirror circuit for the first current source CS1. The bias voltage Vbias may be a voltage supplied to the first current source CS1 and the second current source CS2 in common.

Accordingly, when the switches SW1-SW6 are turned on, a current mirrored with respect to the reference current Iref may flow through the transistors TR707_1-TR707_4 connected respectively to the switches SW1-SW6, the fifth transistor group G5, and the sixth transistor group G6. The level of the current flowing through the second current source CS2 may be proportional to the level of the reference current Iref.

Also, as the width of the transistor increases, the level of current flowing through the transistor may increase. For example, the level of the current flowing through a transistor may be proportional to the width of the transistor. The widths of the transistors TR707_1-TR707_4 may be "16 W", "8 W", "4 W" and "2 W", respectively. Each of the transistors of the fifth transistor group G5 and the sixth transistor group G6 may have a width of "2 W".

Referring to FIG. 10, the fifth transistor group G5 may operate as a transistor having a width of "W". The sixth transistor group G6 may operate as a transistor having a width of "(½)*W". For example, when only the switch SW1 is turned on, a current having a level of "(Iref)/2" may flow to the second current source CS2 through the transistor TR707_1 having a width of "16 W". Similarly, currents having levels of "(Iref)/4", "(Iref)/8", "(Iref)/16", "(Iref)/32" and "(Iref)/64" may flow through the transistors TR707_2-TR707_4, the transistors of the fifth transistor group G5, and the transistors of the sixth transistor group G6, respectively.

When two or more of the switches SW1-SW6 are turned on, the level of the current flowing through the second current source CS2 may be the sum of the levels of the currents flowing through the turned-on switches. That is, the level of the current flowing through the second current source CS2 may be selected as a value proportional to the level of the reference current Iref according to the adjustment code TC.

As current flows through the switch portion SW, the compensation current ITC may be output. Accordingly, the level of the compensation current ITC may correspond to the level of the current flowing through the second current source CS2, and the level of the compensation current ITC may be selected to be proportional to the level of the reference current Iref. For example, whenever the value of the adjustment code TC increases by "000001", the level of the compensation current ITC may increase by "(Iref)/64", which is the level of the current flowing through the transistors of the switch SW6 and the sixth transistor group G6.

As described above, when the sizes of at least one transistor selected from each of the fifth transistor TR705 and the sixth transistor TR706 by the adjustment code TC are substantially the same, the levels of the third sub-current IS3 and the level of the fourth sub current IS4 may be substantially the same. Accordingly, the level of the current flowing through the second current source CS2 may be proportional to the level of the third sub-current IS3.

Similarly to the example embodiments described with reference to FIG. 10, when the levels of the third transistor TR703 and the fourth transistor TR704 are substantially the same, the level of the first sub-current IS1 and the level of the second sub-current IS2 may be substantially the same level. Accordingly, the level of the second sub current IS2 may be proportional to the level of the reference current Iref.

Since the level of the second sub-current IS2 is proportional to the level of the reference current Iref, and the level of the third sub-current IS3 is also proportional to the level of the reference current Iref, in Equation 3, "IS3" may be determined by "IS2". The compensation current generating circuit 730 configured to output a third sub-current IS3 having a level proportional to the level of the second sub-current IS2 may be designed based on the example embodiment described with reference to the operations of the second current source CS2.

Figure 11:
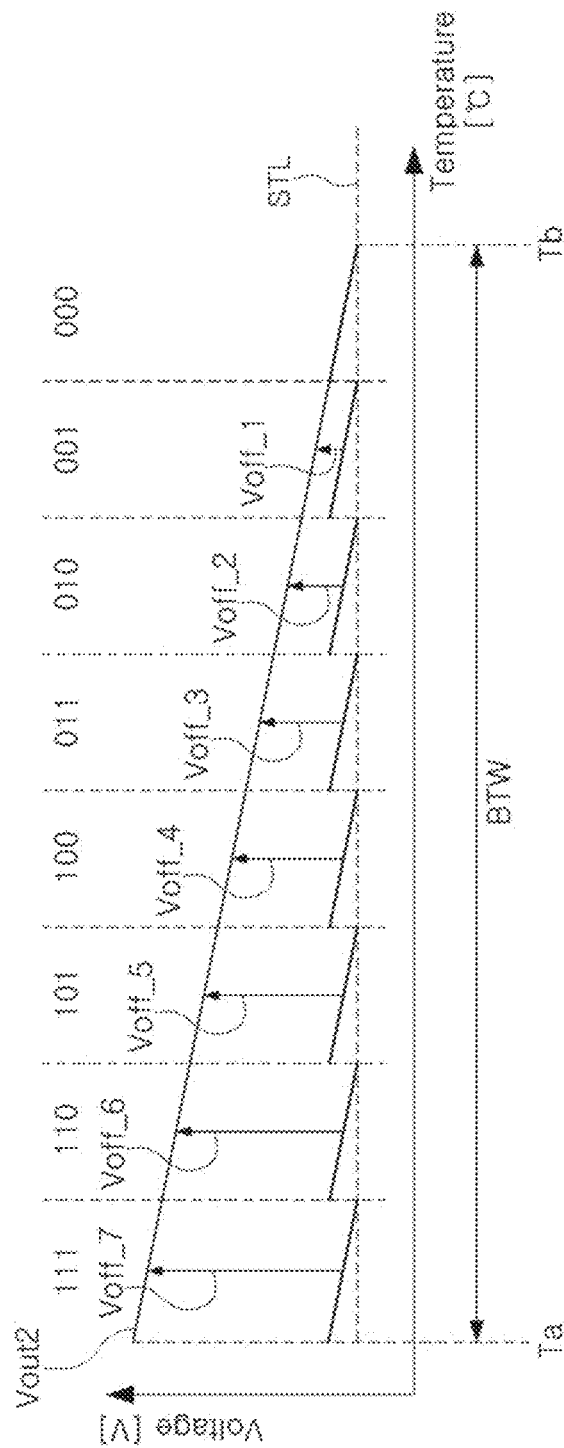
FIG. 11 is a graph illustrating operations of a semiconductor device according to some example embodiments of the present disclosure.

In Equation 3, when W705 has a value proportional to W704 and IS3 has a value proportional to IS2, the level of the feedback voltage Vfb in Equation 3 may be linear with respect to changes of temperature and the adjustment code FIG. 11 is a graph illustrating operations of a semiconductor device according to some example embodiments.

In some example embodiments illustrated in FIG. 11, when the temperature code THC is 3-bit data, the entire temperature section BTW may be divided into of eight temperature sections as indicated in the graph. The reference level ST Level which may be the temperature compensation voltage Vout2 at the highest temperature point Tb may correspond to the reference code Ref Code described with reference to FIG. 3.

The offset voltage Voff may have different values in the plurality of temperature sections. For example, the level of the offset voltage Voff may be 0 in the temperature section corresponding to the temperature code "000". The level of the offset voltage Voff in the temperature section corresponding to the temperature code "001" may be Voff_2. The offset voltage Voff may have Voff_7 in the temperature section corresponding to the temperature code "111". For example, in a temperature section of a lower temperature range, a larger level of offset voltage Voff may be applied.

Figure 12A:
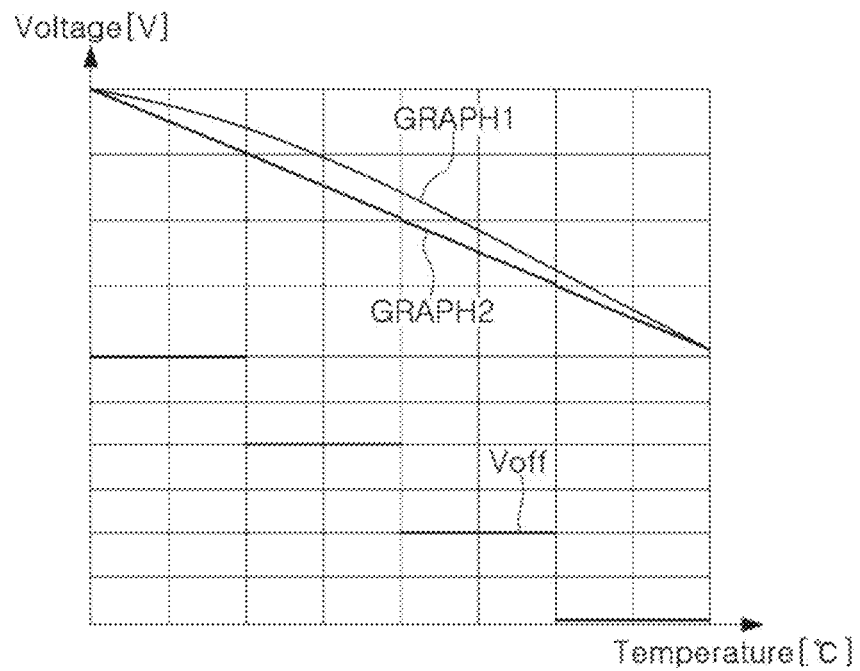
FIGS. 12A and 12B are graphs illustrating operations of a semiconductor device according to some example embodiments of the present disclosure.
Figure 12B:
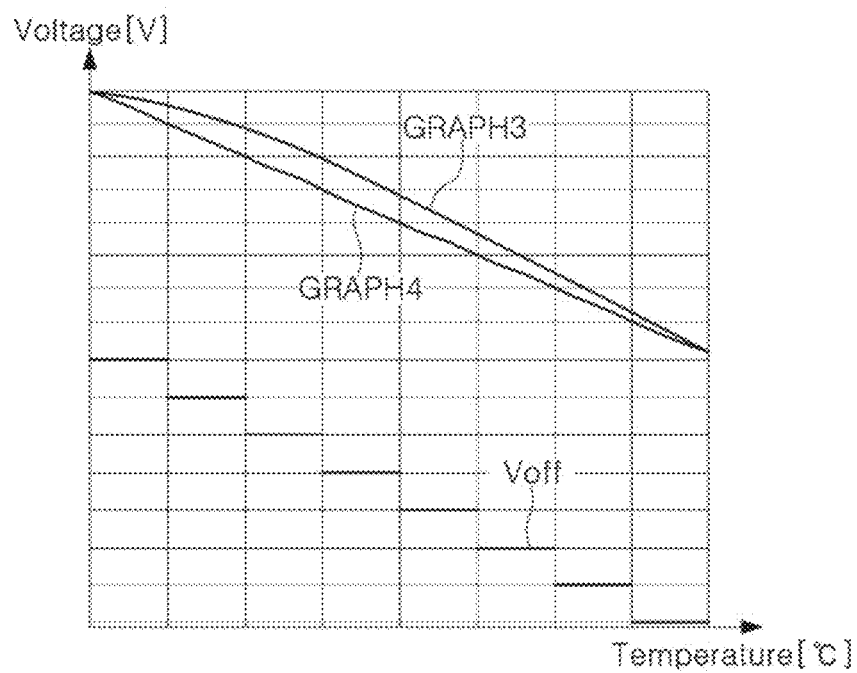

FIGS. 12A and 12B are graphs illustrating operations of a semiconductor device according to some example embodiments.

Referring to FIG. 12A, the first graph GRAPH1 may be a result of a temperature compensation voltage according to a generally used analog temperature method. The second graph GRAPH2 may be a result of a temperature compensation voltage of when the temperature code THC is 2 bits according to some example embodiments.

The first graph GRAPH1 indicating the temperature compensation voltage according to the generally used analog temperature compensation method, when the entire temperature section increases, nonlinear properties according to the temperature and the adjustment code TC may also increase. When the semiconductor device is a memory device storing data, as the nonlinearity of the temperature compensation voltage according to changes in temperature increases, an error of a compensation voltage to be input to program, read, and erase memory cells in response to changes in temperature and also power consumption may increase.

The second graph GRAPH2 illustrating the temperature compensation voltage according to some example embodiments may implement an analog temperature compensation method within each temperature section after the entire temperature section is primarily divided into a plurality of sections. By reducing the range of each temperature section in which the temperature compensation voltage is determined in an analog manner, nonlinear properties of the temperature compensation voltage in the entire temperature section may be reduced. Accordingly, as illustrated in FIG. 12A, the second graph GRAPH2 may appear more linear than the first graph GRAPH1. When the semiconductor device in some example embodiments is configured as a memory device for storing data, by reducing nonlinearity of the temperature compensation voltage, an error in a compensation voltage to be input to program, read, and erase memory cells may be reduced, and performance of the semiconductor device may improve.

In the description below, referring to FIG. 12B, the third graph GRAPH3 may be a result of temperature compensation voltage according to a generally used analog temperature method, and the fourth graph GRAPH4 may be a result of temperature compensation voltage of the example in which the temperature code THC is 3 bits according to some example embodiments Nonlinear properties of the third graph GRAPH3 result according to the generally used analog temperature compensation method and the improved nonlinear properties of the fourth graph GRAPH4 result according to the temperature compensation method according to some example embodiments may be understood with reference to the graphs described above with reference to FIG. 12A.

As compared to the graph in FIG. 12A, fourth graph GRAPH4 in FIG. 12B may be based on 3-bit temperature code THC data higher than 2-bit, higher accuracy may be obtained as compared to the second graph GRAPH2 in FIG. 12A based on 2-bit temperature code THC data. As the number of bits of the temperature code THC increases, the number of temperature sections dividing the entire temperature section increases, and the analog temperature compensation method may be applied within the individual temperature sections of a small range, such that nonlinear properties of the temperature compensation voltage may improve.

Figure 13:
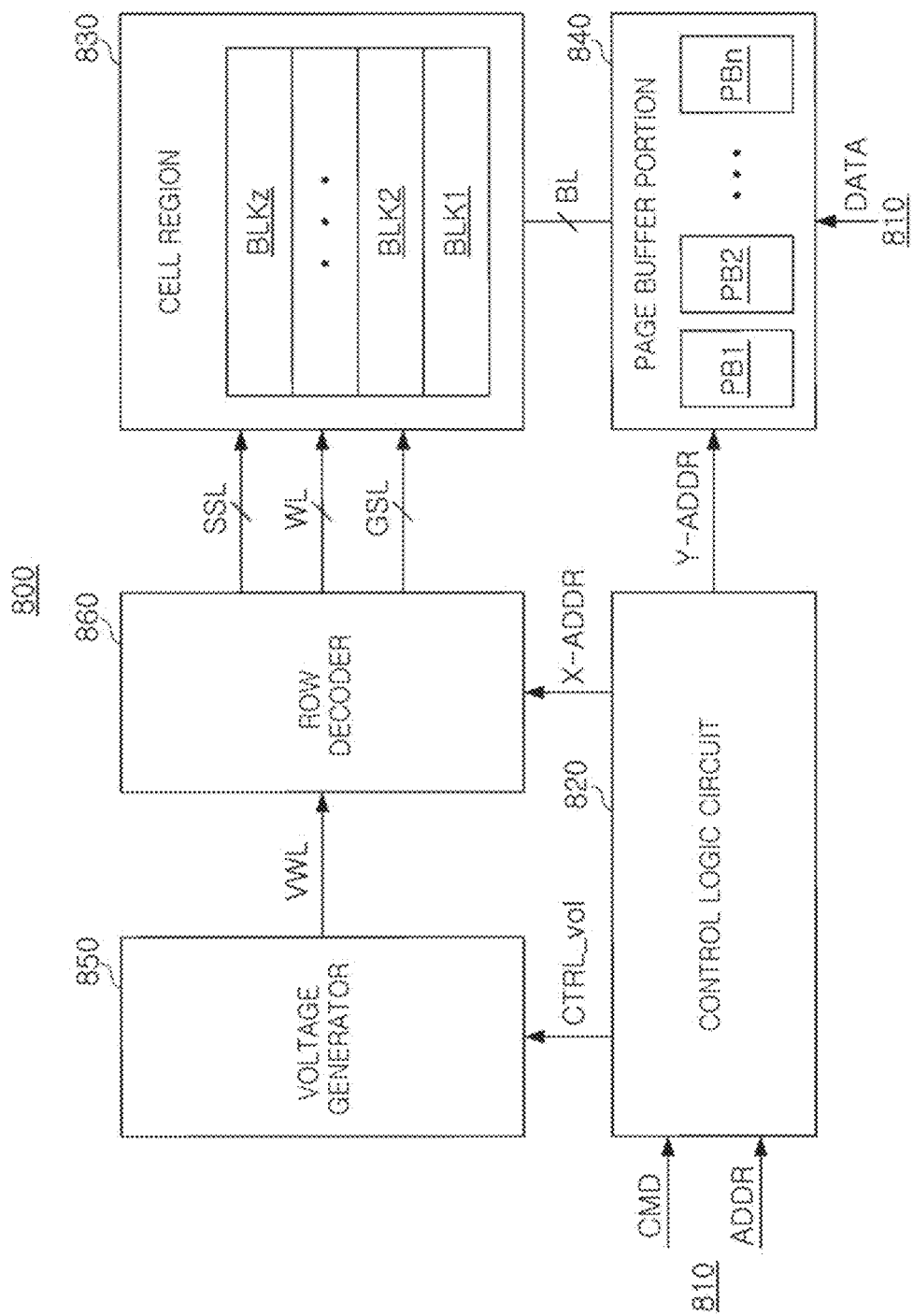
FIG. 13 is a block diagram illustrating a semiconductor device according to some example embodiments of the present disclosure.

FIG. 13 is a block diagram illustrating a semiconductor device according to some example embodiments.

Referring to FIG. 13, a semiconductor device 800 may include a control logic circuit 820, a cell region 830, a page buffer portion 840, a voltage generator 850, and a row decoder 860. The control logic circuit 820, the page buffer portion 840, the voltage generator 850, and the row decoder 860 may be included in the peripheral circuit region. The semiconductor device 800 may further include an interface circuit 810, and may further include a column logic, a pre-decoder, a temperature sensor, a command decoder, an address decoder, and a source driver. The semiconductor device 800 may be implemented as a memory device storing data, such as, for example, a nonvolatile memory device which may maintain stored data even when power is cut off.

The control logic circuit 820 may control overall various operations in the semiconductor device 800. The control logic circuit 820 may output various control signals in response to the command CMD and/or the address ADDR received by the interface circuit 810. For example, the control logic circuit 820 may output a voltage control signal CTRL_vol, a row address X-ADDR, and a column address Y-ADDR.

The cell region 830 may include a plurality of memory blocks BLK1-BLKz (z is a positive integer), and each of the plurality of memory blocks BLK1-BLKz may include a plurality of memory cells. In some example embodiments, the plurality of memory blocks BLK1-BLKz may be separated from each other by isolation regions including an insulating material.

For example, the plurality of memory blocks BLK1-BLKz may include main blocks for storing data, and at least one spare block for storing data required for the operations of the semiconductor device 800. The cell region 830 may be connected to the page buffer portion 840 through bit lines BL, and may be connected to the row decoder 860 through word lines WL, string select lines SSL, and ground select lines GSL.

In some example embodiments, the cell region 830 may include a three-dimensional memory cell array, and the three-dimensional memory cell array may include a plurality of NAND strings. Each NAND string may include memory cells connected to word lines stacked vertically on the substrate, respectively. In some example embodiments, the cell region 830 may include a two-dimensional memory cell array, and the two-dimensional memory cell array may include a plurality of NAND strings disposed in row and column directions.

The page buffer portion 840 may include a plurality of page buffers PB1-PBn (n is an integer equal to or greater than 3), and the plurality of page buffers PB1-PBn may be connected to the memory cells through a plurality of bit lines BL, respectively. The page buffer portion 840 may select at least one bit line among the bit lines BL in response to the column address Y-ADDR. The page buffer portion 840 may operate as a write driver or a sense amplifier according to an operation mode. For example, during a program operation, the page buffer portion 840 may apply a bit line voltage corresponding to data to be programmed to the selected bit line. During a read operation, the page buffer portion 840 may sense the data stored in the memory cell by sensing a current or voltage of the selected bit line. Data to be programmed into the cell region 830 through a program operation and data read from the cell region 830 through a read operation may be input/output through the interface circuit 810.

The voltage generator 850 may generate various types of voltages for performing program, read, and erase operations based on the voltage control signal CTRL_vol. For example, the voltage generator 850 may generate a program voltage, a read voltage, a pass voltage, a program verify voltage, and an erase voltage. In some example embodiments, the control logic circuit 820 may control the voltage generator 850 to generate a voltage for executing program, read, and erase operations using data stored in the spare block. A portion of the voltages generated by the voltage generator 850 may be input to the word lines WL as the word line voltage VWL by the row decoder 860, and a portion of the voltages may be input to the common source line by the source driver.

The row decoder 860 may select one of the plurality of word lines WL and select one of the plurality of string select lines SSL in response to the row address X-ADDR. For example, the row decoder 860 may apply a program voltage and a program verify voltage to a selected word line during a program operation, and the row decoder 860 may apply a read voltage to the selected word line during a read operation.

Memory cells may be affected by temperature. For example, the threshold voltage of the memory cells may increase as the temperature decreases. The control logic circuit 820 may include a temperature sensor. The control logic circuit 820 may output a voltage control signal CTRL_vol to the voltage generator 850 to output a voltage compensating for a threshold voltage changing in response to changes in temperature. For example, during a program operation, when a threshold voltage increases due to a decrease in temperature, a voltage control signal CTRL_vol for increasing the program voltage to properly program the memory cells may be output by the control logic circuit 820. Also, during a read operation, a voltage control signal CTRL_vol for increasing a read voltage to read data of programmed memory cells may be output by the control logic circuit 820. As the control logic circuit 820 outputs an appropriate voltage control signal CTRL_vol corresponding to changes in temperature to the voltage generator 850 to properly program, read, and erase memory cells, performance of the semiconductor device may improve and reliability may increase.

Figure 14:
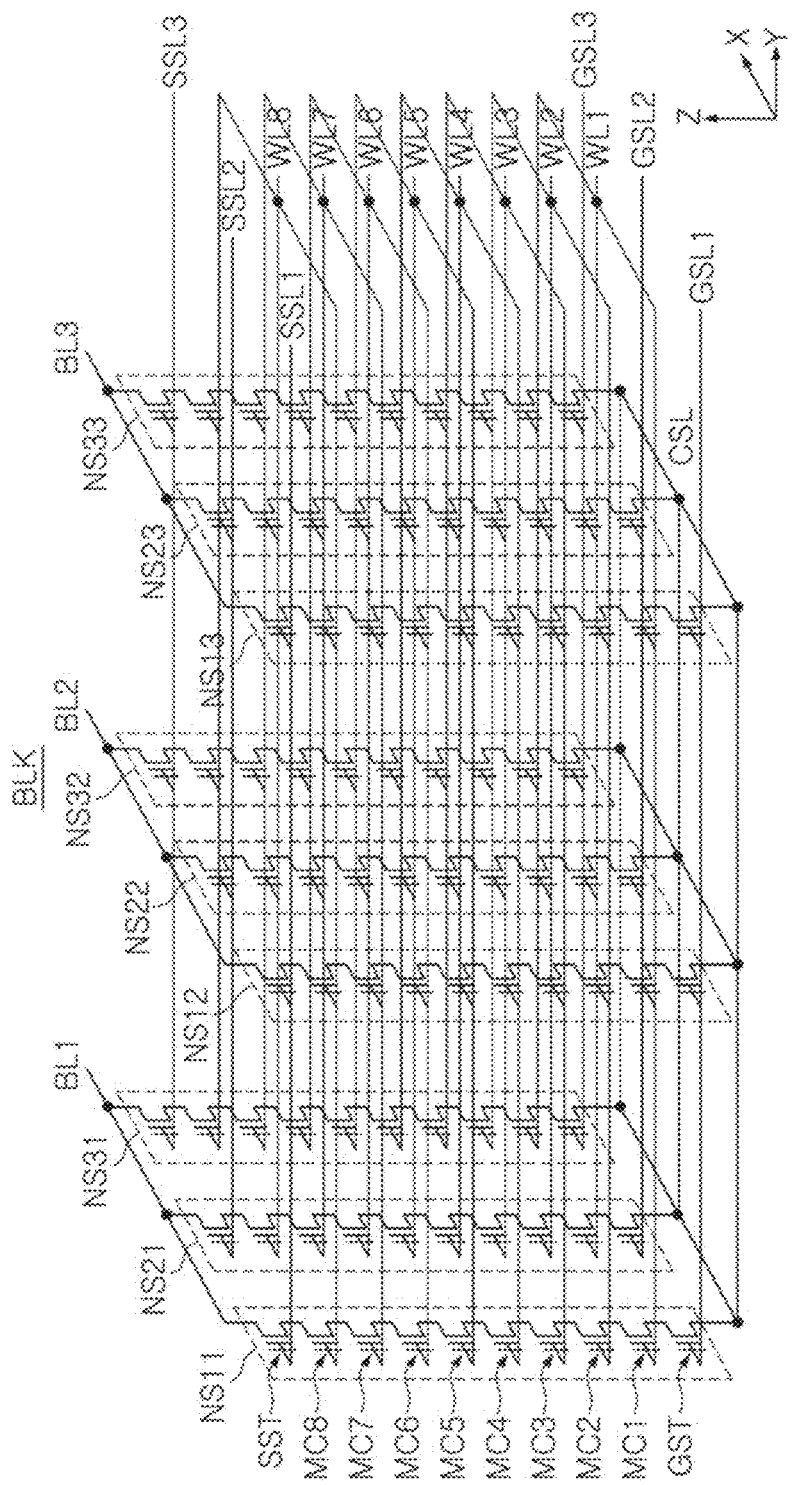
FIG. 14 is a circuit diagram illustrating a block included in a cell region of a semiconductor device according to some example embodiments of the present disclosure.

FIG. 14 is a circuit diagram illustrating a block included in a cell region of a semiconductor device according to some example embodiments.

Referring to FIG. 3, a memory block BLK may include a plurality of NAND strings NS11-NS43 connected between the bit lines BL1-BL3 and the common source line CSL. Each of the plurality of NAND strings NS11-NS43 may include a string select transistor SST, a plurality of memory cells MC1-MC8, and a ground select transistor GST. For example, each of the plurality of memory NAND strings NS11-NS43 may include eight memory cells MC1-MC8, but some example embodiments thereof is not limited thereto.

The string select transistor SST may be connected to the corresponding string select lines SSL1-SSL3. The plurality of memory cells MC1-MC8 may be connected to corresponding word lines WL1-WL8, respectively. In some example embodiments, at least one of the word lines WL1-WL8 may be provided as a dummy word line. The ground select transistor GST may be connected to the corresponding ground select lines GSL1-GSL2. The string select transistor SST may be connected to the corresponding bit lines BL1-BL3, and the ground select transistor GST may be connected to the common source line CSL.

Word lines (e.g., WL1) of the same level may be connected in common, and at least a portion of the ground select lines GSL1-GSL3 and the string select lines SSL1-SSL3 may be separated from each other. FIG. 14 illustrates the example in which the memory block BLK is connected to eight word lines WL1-WL8 and three bit lines BL1-BL3, but some example embodiments thereof is not limited thereto.

Figure 15:
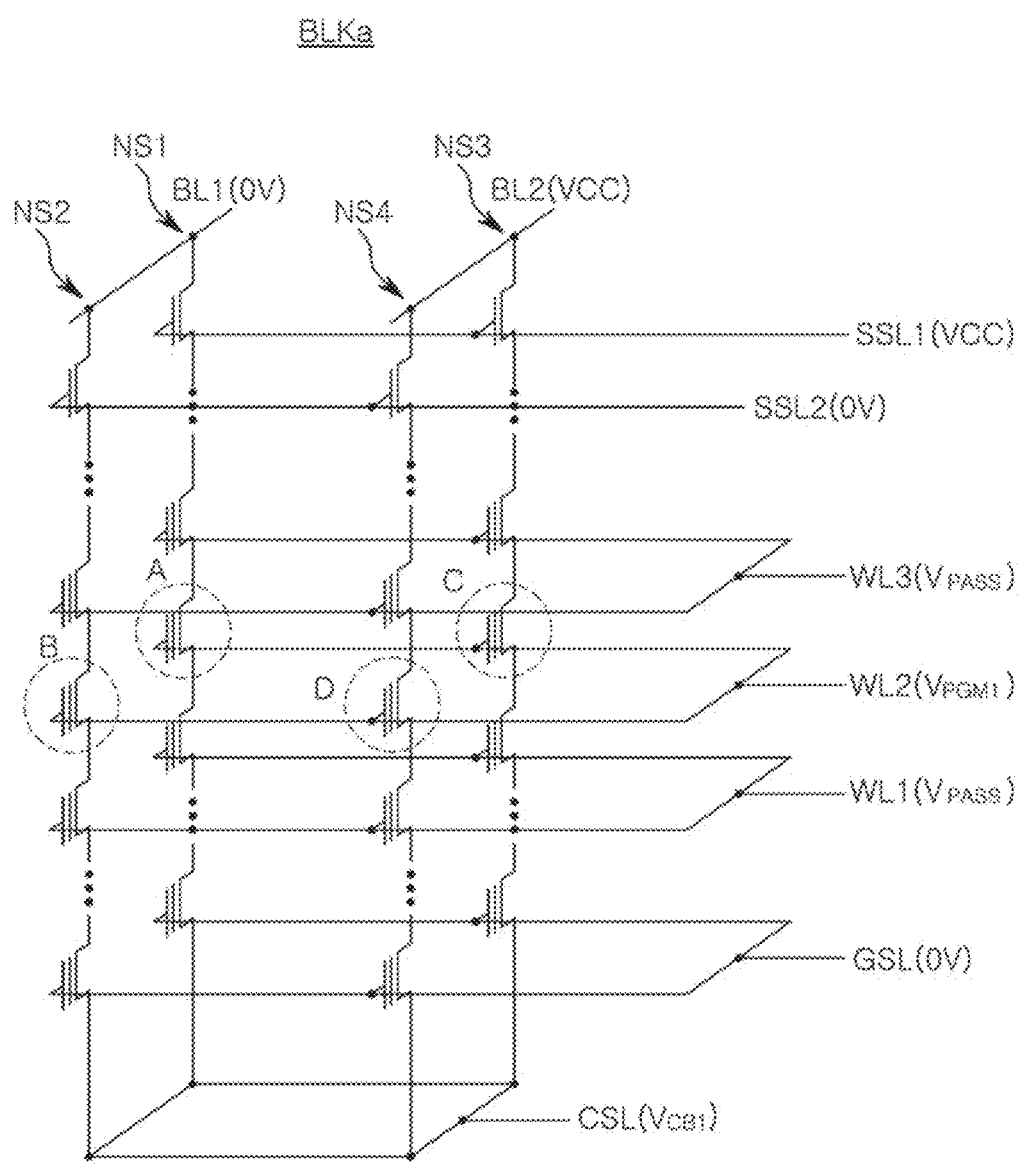
FIG. 15 is a diagram illustrating operations of a semiconductor device according to some example embodiments of the present disclosure.

FIG. 15 is a diagram illustrating operations of a semiconductor device according to some example embodiments.

Referring to FIG. 15, a semiconductor device in some example embodiments may be implemented as a memory device, and as described above, the memory device may include a cell region and a peripheral circuit region, and may further include a plurality of NAND strings NS1-NS4. The plurality of NAND strings NS1-NS4 may be included in a single block and may share the word lines WL1-WL3. The first and second NAND strings NS1 and NS2 may be connected to the first bit line BL1 in common, and the third and fourth NAND strings NS3 and NS4 may be connected to the second bit line BL2 in common.

The first and third NAND strings NS1 and NS3 may be connected to the first string select line SSL1 in common, and the second and fourth NAND strings NS2 and NS4 may be connected to the second string select line SSL2 in common. The plurality of NAND strings NS1-NS4 may share a single ground select line GSL and a single common source line CSL. In some example embodiments, the selected memory cell A may be included in the first NAND string NS1 and may be connected to the second word line WL2.

FIG. 15 may be a diagram illustrating bias voltages input to the plurality of NAND strings NS1-NS4 while programming the selected memory cell A. The level of the bias voltages may be determined by a peripheral circuit region. During the program execution time, a ground voltage may be input to the first bit line BL1 which may be the selected bit line, and a power voltage VCC higher than the ground voltage may be input to the second bit line BL2 which may be a non-selected bit line. The power supply voltage VCC may be input to the first string select line SSL1 connected to the first NAND string NS1, and a ground voltage may be input to the second string select line SSL2. The first program voltage $V_{PGM1}$ may be input to the second word line WL2 which may be the program word line, and the pass voltage $V_{PASS}$ may be input to the other first and third word lines WL1 and WL3.

In some example embodiments, a value of the pass voltage $V_{PASS}$ input to the first and third word lines WL1 and WL3 and a value of the first program voltage $V_{PGM1}$ input to the second word line WL2 may be determined differently according to the temperature detected prior to or during the program operation. To this end, the peripheral circuit region may include a circuit for outputting a temperature compensation voltage according to at least one of the aforementioned example embodiments.

For example, when the temperature decreases, the threshold voltages of the memory cells A-D may increase. Accordingly, to sufficiently increase a threshold voltage of the selected memory cell A, the peripheral circuit region may increase the level of the first program voltage $V_{PGM1}$ and may also increase the level of the pass voltage $V_{PASS}$ to prevent or reduce the disturbance caused by increasing the level of the first program voltage $V_{PGM1}$.

Similarly, in a read operation, voltages input to the word lines WL1-WL3 may change in consideration of temperature. For example, when data of the selected memory cell A is read, a read voltage may be input to the second word line WL2 and a pass voltage may be input to the other word lines including the first and third word lines WL1 and WL3.

The read voltage may have a level between threshold voltage distributions which the selected memory cell A may have depending on whether a program operation is performed. As described above, when the temperature increases, the threshold voltage of the selected memory cell A may decrease, and when the temperature decreases, the threshold voltage of the selected memory cell A may increase. Accordingly, in some example embodiments, when the temperature increases, the peripheral circuit region may decrease the level of the read voltage with reference to the temperature compensation voltage indicating the increased temperature. When the temperature decreases, the peripheral circuit region may increase the level of the read voltage with reference to the temperature compensation voltage indicating the decreased temperature.

According to the aforementioned example embodiments, the first voltage determined according to the temperature of the semiconductor device may be converted into a temperature code which may be digital data, and the temperature code may correspond to one of a plurality of temperature ranges which the temperature of the semiconductor device may have. By determining the temperature compensation voltage in an analog manner for the temperature section to which the temperature code belongs, a temperature compensation circuit which may swiftly and accurately sense the temperature of the semiconductor device and may output the temperature compensation voltage may be provided. Also, the semiconductor device may control the memory cells using the temperature compensation voltage output by the temperature compensation circuit, thereby improving performance and reliability of the semiconductor device.

When the terms "about" or "substantially" are used in this specification in connection with a numerical value, it is intended that the associated numerical value includes a manufacturing or operational tolerance (e.g., ±10%) around the stated numerical value. Moreover, when the words "generally" and "substantially" are used in connection with geometric shapes, it is intended that precision of the geometric shape is not required but that latitude for the shape is within the scope of the disclosure. Further, regardless of whether numerical values or shapes are modified as "about" or "substantially," it will be understood that these values and shapes should be construed as including a manufacturing or operational tolerance (e.g., ±10%) around the stated numerical values or shapes.

The semiconductor device 10 (or other circuitry, for example, voltage generating circuit 11, temperature compensation voltage generating circuit 12, semiconductor device 100, voltage generating circuit 110/210, first voltage generating circuit 111/211, analog-to-digital converter 112/212, first code conversion logic 113/213, second code conversion logic 114/214, offset voltage generating circuit 115/215, second voltage generating circuit 116/216, temperature compensation voltage generating circuit 120/220, adder 217, decoder 410, compensation circuit 510/600/700, current mirror circuit 610/710, reference current generating circuit 620/720, compensation current generating circuit 630/730, semiconductor device 800, control logic circuit 820, cell region 830, page buffer portion 840, voltage generator 850, and row decoder 860) may include hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc.

While the example embodiments have been illustrated and described above, it will be configured as apparent to those skilled in the art that modifications and variations could be made without departing from the scope of the present disclosure as defined by the appended claims.

What is claimed is:

1. A semiconductor device, comprising:
   a first voltage generating circuit configured to output a first voltage based on a temperature;
   an analog-to-digital converter configured to convert the first voltage into a temperature code;
   a code conversion logic configured to output an offset code and a level code of a temperature section to which the temperature belongs among a plurality of temperature sections based on the temperature code;
   an offset voltage generating circuit configured to output an offset voltage based on the offset code;
   a second voltage generating circuit configured to output a second voltage having a constant value within a temperature section to which the temperature belongs among the plurality of temperature sections based on the level code; and
   a temperature compensation voltage generating circuit configured to
   receive the first voltage, the second voltage, the offset voltage, and a feedback voltage, the feedback voltage being based on the first voltage, the second voltage, and the offset voltage, and
   output a temperature compensation voltage.

2. The semiconductor device of claim 1, wherein a number of the plurality of temperature sections is based on a resolution of the analog-to-digital converter.

3. The semiconductor device of claim 1, wherein
   a number of bits of the offset code is based on a resolution of the offset voltage generating circuit, and
   the number of bits of the level code is based on a resolution of the second voltage generating circuit.

4. The semiconductor device of claim 1, wherein the temperature compensation voltage generating circuit is configured to
   receive the first voltage, the second voltage, the offset voltage, the feedback voltage, and an adjustment code, and
   output the temperature compensation voltage based on the adjustment code.

5. The semiconductor device of claim 1, wherein the second voltage in each of the plurality of temperature sections is equal to a first voltage at a start point of each of the plurality of temperature sections.

6. The semiconductor device of claim 1, wherein
   the offset voltage generating circuit is configured to output the offset voltage based on a value obtained by adding a reference code to the offset code, and
   the reference code corresponds to the temperature compensation voltage at a highest temperature in the plurality of temperature sections.

7. The semiconductor device of claim 1, wherein the second voltage generating circuit includes variable resistor devices configured to have a resistor value based on the level code.

8. The semiconductor device of claim 7, wherein the second voltage generating circuit includes a decoder configured to receive the level code,
a plurality of resistors connected to each other in series, and
a plurality of transistors configured to receive an output value of the decoder.

9. The semiconductor device of claim 1, wherein the temperature compensation voltage generating circuit includes
a first NMOS device configured to receive the first voltage,
a second NMOS device configured to receive the second voltage,
a third NMOS device configured to receive the offset voltage,
a fourth NMOS device configured to receive the feedback voltage,
a first current source configured to output a constant reference current, and
a second current source configured to output a compensation current by receiving an adjustment code.

10. The semiconductor device of claim 9, wherein
the first NMOS device and the third NMOS device are connected to each other in parallel, and
the second NMOS device and the fourth NMOS device are connected to each other in parallel.

11. The semiconductor device of claim 9, wherein an intensity ratio between a current flowing through the first NMOS device and the second NMOS device and a current flowing through the third NMOS device and the fourth NMOS device is based on the adjustment code.

12. The semiconductor device of claim 9, wherein
each of the first NMOS device and the second NMOS device has a first width, and
each of the third NMOS device and the fourth NMOS device has a second width.

13. The semiconductor device of claim 12, wherein a temperature compensation voltage is based on a ratio between the first width and the second width.

14. A semiconductor device, comprising:
a cell region including a plurality of memory cells; and
a peripheral circuit region including peripheral circuits driving the cell region, the peripheral circuit region including
a first voltage generating circuit configured to output a first voltage based on a temperature;
an analog-to-digital converter configured to convert the first voltage into a temperature code;
an offset voltage generating circuit configured to output an offset voltage of a temperature section to which the temperature belongs among a plurality of temperature sections based on the temperature code;
a second voltage generating circuit configured to output a second voltage having a constant value within a temperature section to which the temperature belongs among the plurality of temperature sections based on the temperature code; and
a temperature compensation voltage generating circuit configured to receive the first voltage, the second voltage, the offset voltage, and a feedback voltage and to output a temperature compensation voltage, the feedback voltage being based on the first voltage, the second voltage, and the offset voltage.

15. The semiconductor device of claim 14, wherein peripheral circuit region is configured to determine a level of a voltage input to the cell region based on the temperature compensation voltage.

16. The semiconductor device of claim 14, wherein
the peripheral circuit region includes a row decoder connected to the cell region through a plurality of word lines, a plurality of ground select lines, a plurality of string select lines, and a common source line, and
the row decoder is configured to determine a level of a voltage input to at least one of the plurality of word lines, the plurality of ground select lines, the plurality of string select lines, and the common source line based on the temperature compensation voltage.

17. The semiconductor device of claim 16, wherein the row decoder is configured to determine a level of at least one of a program voltage input to a selected word line connected to a selected memory cell among the plurality of memory cells during a program operation and a pass voltage input to non-selected word lines connected to memory cells other than the selected memory cell among the plurality of memory cells, with reference to the temperature compensation voltage.

18. The semiconductor device of claim 16, wherein the row decoder is configured to determine a level of at least one of a read voltage input to a selected word line connected to a selected memory cell among the plurality of memory cells during a read operation and a pass voltage input to non-selected word lines connected to memory cells other than the selected memory cell among the plurality of memory cells, with reference to the temperature compensation voltage.

19. The semiconductor device of claim 14, wherein the temperature compensation voltage generating circuit includes a first NMOS device configured to receive the first voltage, a second NMOS device configured to receive the second voltage, a third NMOS device configured to receive the offset voltage, a fourth NMOS device configured to receive the feedback voltage, and a current source configured to output a current to the third NMOS and the fourth NMOS devices by receiving an adjustment code.

20. A semiconductor device, comprising:
a voltage generating circuit configured to output an offset voltage corresponding to each of a plurality of temperature sections based on a first voltage, the first voltage based on a temperature of an integrated circuit, and the voltage generating circuit configured to output a second voltage which is constant in each of the plurality of temperature sections based on the first voltage; and
a temperature compensation voltage generating circuit configured to receive the first voltage, the second voltage, the offset voltage, and a feedback voltage and to output a temperature compensation voltage, the feedback voltage being based on the first voltage, the second voltage, and the offset voltage.

* * * * *